INVENTOR.
FRED STERZER
BY Eugene M. Whitacre
ATTORNEY

INVENTOR.
FRED STERZER
BY Eugene M. Whitacre
ATTORNEY

United States Patent Office 3,208,003

Patented Sept. 21, 1965

3,208,003
NEGATIVE RESISTANCE AMPLIFIER UTILIZING A DIRECTIONAL FILTER

Fred Sterzer, Monmouth Junction, N.J., assignor to Radio Corporation of America, a corporation of Delaware Filed Mar. 24, 1961, Ser. No. 98,210
6 Claims. (Cl. 330—61)

This invention relates to amplifying circuits and more particularly to amplifying circuits employing two-terminal negative resistance circuit networks.

A variety of two terminal negative resistance amplifiers such as parametric amplifiers, masers and tunnel diode amplifiers, have been heretofore disclosed in the art. The gain of two-terminal negative resistance amplifying circuits is a function of the relationship of the effective negative resistance exhibited by the circuit and the positive impedances of the signal source and load circuits. One of the major problems in the design and operation of two-terminal negative resistance amplifiers is to maintain the desired relationship between the negative resistance and the positive impedances such that the circuit is stable and does not break into oscillation under operating conditions. The problem is particularly difficult since the combined impedances of the signal source and load circuits must be of a value to satisfy the desired relationship at any frequency in the entire spectrum over which the negative resistance amplifying circuit exhibits a negative resistance, even though the amplifier passband is only a small fraction of this spectrum.

Accordingly, it is an objective of this invention to provide an improved negative resistance amplifier.

It is another object of this invention to provide an improved negative resistance amplifier which is not subject to spurious oscillations.

It is a further object of this invention to provide an improved negative resistance amplifier wherein a substantially constant load impedance is presented to the negative resistance amplifying circuit over the entire frequency range in which the circuit exhibits a negative resistance.

In accordance with the invention, a negative resistance amplifier is coupled to signal source and load circuits by means of a suitable frequency responsive network. Such frequency responsive networks are known per se and exhibit the property of providing a low impedance path for the flow of signal currents between the negative resistance amplifying circuit and the signal source and load circuits within the amplifier frequency passband but electrically isolating the negative resistance amplifier from the signal and load circuits at frequencies outside of the amplifier passband while presenting an impedance to the negative resistance amplifier of a value to insure stabilization. Specific examples of such frequency responsive networks are described in the article "Directional Channel-Separation Filters," Proc. of the IRE, pp. 1018–1024, August 1956, and have been termed therein "directional filters."

A directional filter is an eight terminal device which exhibits the characteristic that, within its frequency passband, wave energy incident on a first pair of the terminals is transmitted substantially unattenuated to a second pair of the terminals and vice versa, but not to the third or fourth pairs of the terminals. However outside of the frequency passband of the directional filter, the first and second pairs of terminals are electrically isolated from each other and wave energy incident on these terminals is transmitted to the third and fourth pairs of terminals respectively. At all frequencies, the third pair of terminals is electrically isolated from the second pair of terminals and the fourth pair of terminals is electrically isolated from the first pair of terminals.

In accordance with the invention, a negative resistance amplifying circuit is coupled to the first pair of terminals of such a directional filter while suitable signal source and load circuits are coupled to the second pair of terminals thereof. A pair of resistors of equal magnitude are coupled to the third and fourth pairs of terminals of the directional filter to provide a proper impedance termination. Throughout the frequency passband of the filter, which is designed to coincide with the amplifier frequency passband, the negative resistance amplifying circuit is coupled to the signals source and load circuits to provide amplification of applied signals. The negative resistance amplifying circuit is designed so that the impedances of the signal source and load circuits present the proper impedance to the negative resistance amplifying circuit to provide high gain within circuit stability.

Outside the frequency passband of the filter, the negative resistance amplifying circuit is electrically isolated from the signal source and load circuits and is electrically connected to the terminating resistor at the third pair of terminals of the filter. The magnitude of the terminating resistor is chosen to present the proper impedance to the negative resistance amplifying circuit to prevent spurious oscillations from occurring at these frequencies.

Further in accordance with the invention, a suitable non-reciprocal device having a substantially constant output impedance may be used to couple both the source and the load to the directional filter. One type of non-reciprocal device which may be used is a ferrite circulator. The circulator provides a constant impedance at the input terminals of the directional filter over the amplifier passband despite variations in the impedance of the source and load circuits. The impedance is selected to maintain the negative resistance amplifier stable over the amplifier passband so that severe changes in source and load impedances will not produce instability.

The novel features that are considered to be characteristic of this invention are set forth with particularity in the appended claims. The invention itself, however, both as to its organization and method of operation as well as additional objects and advantages thereof, will best be understood from the following description when in conjunction with the accompanying drawing in which:

Figure 1:
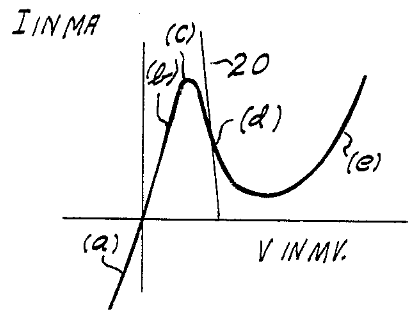
FIGURE 1 is a graph illustrating the current-voltage characteristic of a negative resistance diode suitable for use in a negative resistance amplifier embodying the invention.

Reference is now made to FIGURE 1 which illustrates the current-voltage characteristic of a negative resistance diode suitable for use in negative resistance amplifiers embodying the invention. For small bias voltages in the reverse direction, the reverse current of the negative resistance diode increases as a function of voltage as is indicated by the region ($a$). For small forward bias voltages, the initial forward current increases as a function of voltage as is shown by region (*b*). As the forward voltage is increased further, the forward current reaches a maximum, region (*c*), and then begins to decrease. The decrease continues throughout the region (*d*), which is the negative resistance region, until the forward current reaches a minimum, whereupon the characteristic turns into the usual forward behaviour of a semiconductor diode, region (*e*). A type of diode having such a characteristic is known as a tunnnel diode and has been disclosed by H. S. Sommers in the article "Tunnel Diodes as High Frequency Devices," Proc. of the IRE, July 1959, p. 1201.

To bias the diode for stable operation in the negative resistance region of its current-voltage characteristic requires a suitable voltage source having a smaller internal resistance than the absolute value of the minimum negative resistance of the diode. Such a voltage source has a D.-C. load line 20 which is characterized by a current-voltage relationship which has a steeper slope than the negative slope of the diode characteristic and intersects the diode characteristic at only one point in the negative resistance region (*d*).

A diode having a characteristic described above may comprise the active element of a two terminal negative resistance amplifier as will be described in connection with FIGURE 5. However any two terminal amplifier circuit such as a master or a parametric amplifier circuit may be used in the combination of the invention.

Figure 2:
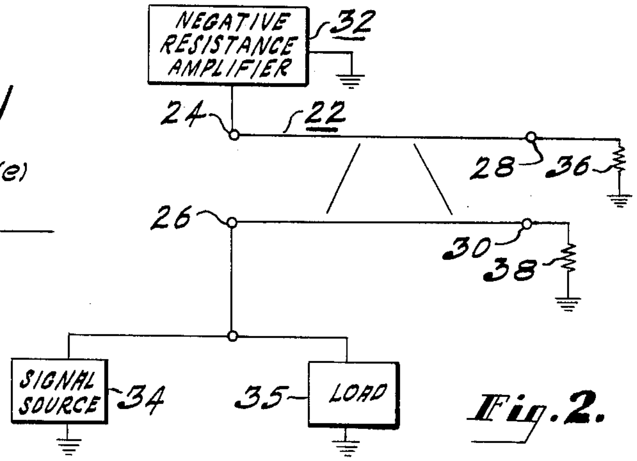
FIGURE 2 is a schematic circuit diagram, partly in block form, of a negative resistance amplifier embodying the invention.

Referring to FIGURE 2, an amplifier in accordance with the invention includes a frequency responsive network in the form of a transmission line directional filter 22 having four pairs of terminals 24, 26, 28 and 30. A two-terminal negative resistance amplifying circuit 32 is coupled to the first pair of terminals 24 while signal source 34 and load 35 circuits are coupled to the second pair of terminals 26. The signal source circuit 34 may for example comprise a suitable antenna circuit. A pair of terminating resistors 36 and 38 are coupled to the third and fourth pairs of terminals 28 and 30 respectively of the directional filter 22.

Figures 3, 4:
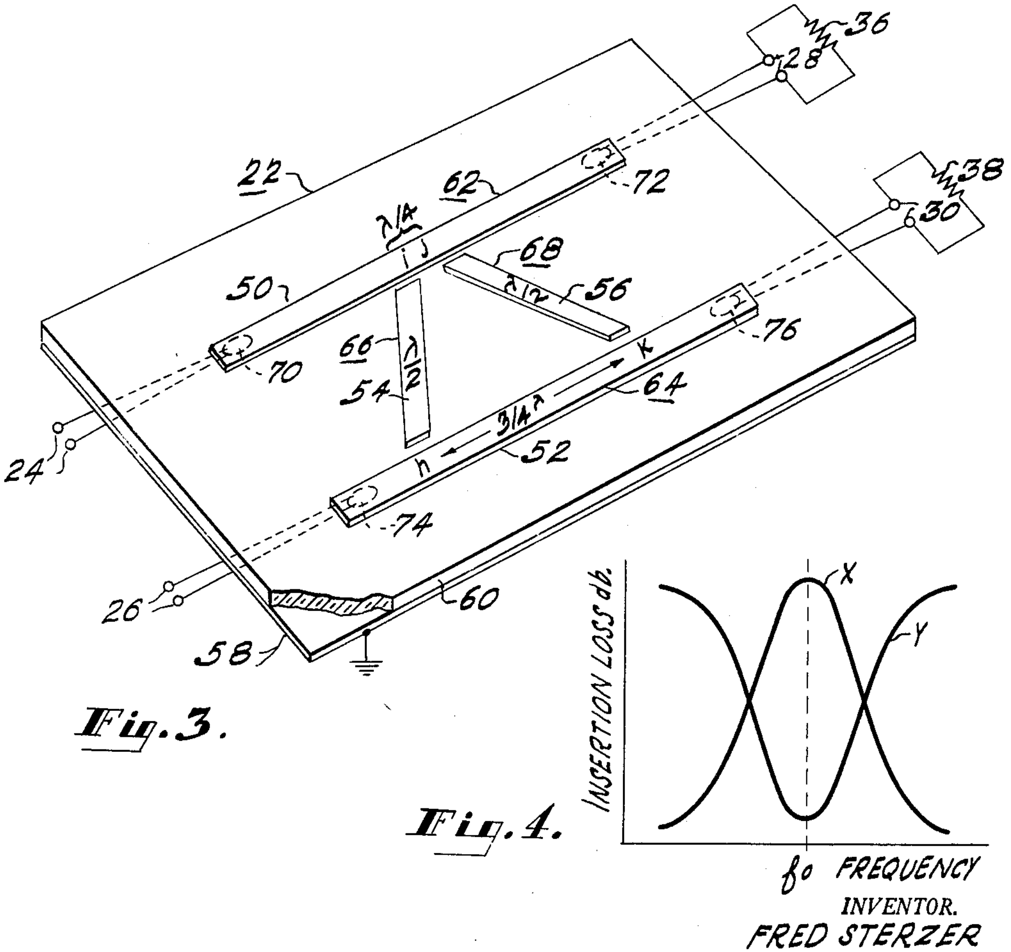
FIGURE 3 is a perspective view, partly in schematic form, of a transmission line directional filter suitable for use in the circuit of FIGURE 2.
FIGURE 4 is a graph illustrating a typical insertion loss vs. frequency characteristic of a directional filter suitable for use in a negative resistance amplifier embodying the invention.

One type of directional filter which may be untilized in the circuit of FIGURE 2 is shown in FIGURE 3, and is of the so called strip transmission line construction. Commercially available microstrip transmission line comprises a pair of parallel, planar, conducting surfaces separated by suitable insulating means 60. One surface of the microstrip transmission line is processed, using known techniques, to form a plurality of spaced conductors 50, 52, 54 and 56 while the other surface 58 forms a ground plane for these conductors.

The conductors 50 and 52 are formed in spaced and substantially parallel relationship with each other while the conductors 54 and 56 are inclined toward each other in the form of an inverted V between the conductors 50 and 52. The conductors 54 and 56 are electrically spaced from each other at the base end by an electrical distance which is equal to three-quarters of a wavelength at the mean operating frequency of the directional filter 22 at the apex end by an electrical distance equal to one-quarter of a wave length at the same frequency. At both the base and apex ends, the conductors 54 and 56 approach closely to, but are separated from the conductors 50 and 52 to provide capacitive coupling therebetween.

Each of the conductors 50, 52, 54 and 56 in conjunction with the ground plane 58 form separate transmission lines 62, 64, 66 and 68 respectively. The conductors 54 and 56 are made an electrical length equal to one-half of a wave length at the mean operating frequency of the directional filter 22 thereby making the transminssion lines 66 and 68 half wave resonators at this frequency. The characteristic impedances of each of the transmission lines 62, 64, 66 and 68 are made equal and in this instance 50 ohms.

A pair of coaxial connectors 70 and 72 (shown dotted), each including an outer conductor connected to the ground plane 58 and an inner conductor which passes through an aperture in the ground plane 58 to make contact with the conductor 50, are mounted on the ends of the transmission line 62 and define the two pairs of terminals 24 and 28 previously numbered in connection with FIGURE 2. A similar pair of connectors 74 and 76 are mounted on the ends of the transmission line 64 and define the pairs of terminals 26 and 30 respectively. The pair of terminating resistors 36 and 38 are connected across the terminals 28 and 30 respectively and are selected to have a resistance magnitude which terminates the transmission lines 62 and 64 in their characteristic impedance.

The directional filter 22 exhibits the characteristic that wave energy within the frequency passband of the filter which is incident on the terminals 26 is transmitted to the terminals 24 but not to the terminals 28 or 30. Similarly wave energy incident on the terminals 24 within the same frequency passband is transmitted to the terminals 26 but not to the terminals 28 or 30. A study of the phase relations shows that for wave energy incident on the terminals 26, the electrical distance from point (*h*) to point (*k*) in the transmission line 64 is ¾λ at the means operating frequency of the filter 22 while the electrical distance from point (*h*) to (*k*) along the path *h–i–j–k* is 1¼λ. Therefore at the point (*k*) in the transmission line 64 the different components of wave energy arrive 180° out of phase. Thus a cancellation of wave energy occurs and substantially no wave energy is transmitted to the terminals 30. A similar cancellation of wave energy also occurs at the point (*j*) in the transmission line 62 so that substantially no wave energy is transmitted to the terminals 28. A similar phase relationship may be shown to exist for wave energy incident on the terminals 24.

However, outside of the frequency passband of the directional filter 22, the transmission lines 66 and 68 no longer function as half wave resonators and therefore prevent substantial wave energy transmission therethrough. Thus the transmission lines 62 and 64 are electrically isolated from each other at frequencies outside of the amplifier passband and wave energy incident on terminals 24 and 26 is transmitted to the terminals 28 and 30 respectively. With the terminating resistors 36 and 38 having a resistance magnitude substantially equal to the characteristic impedance of the transmission lines 62 and 64, substantially all of the wave energy is dissipated in these resistors with no reflections occuring. Consequently outside of the frequency passband of the directional filter 22, the terminals 24 and 26 are electrically isolated from each other.

FIGURE 4 shows the the insertion loss in decibels, as measured between the terminals 26 and 30 (curve X) and between the terminals 26 and 24 (curve Y), as a function of frequency for a typical directional filter with wave energy incident on the terminals 26. A similar characteristic is obtained with wave energy incident on the terminals 24. The insertion loss of course is a measure of the degree of isolation between these terminals at the various frequencies.

Figures 5, 6, 7:
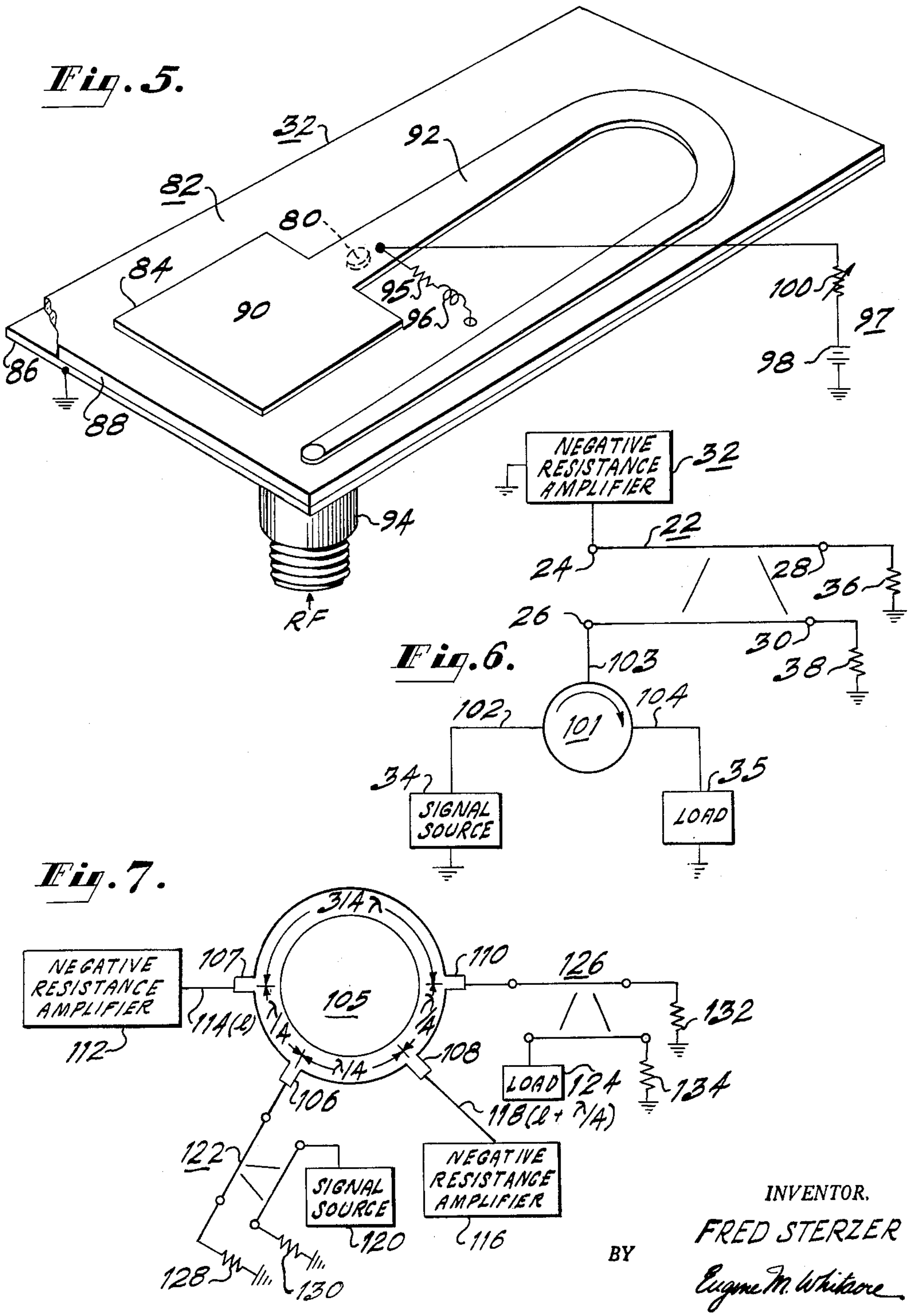
FIGURE 5 is a perspective view, partly in schematic form, of a negative resistance diode amplifying circuit suitable for use in the circuit of FIGURE 2.
FIGURE 6 is a schematic circuit diagram, partly in block form, of another embodiment of the invention.
FIGURE 7 is a schematic circuit diagram, partly in block form, of still another embodiment of the invention.

One type of two-terminal negative resistance amplifying circuit which may be utilized in the circuit of FIGURE 2 is shown in FIGURE 5. The negative resistance amplifying circuit 32 includes a negative resistance diode 80 of the type having a current-voltage characteristic as shown in FIGURE 1. The diode 80 is mounted in a transmission line structure 82 of microwave strip transmission line which includes a pair of parallel conductors 84 and 86 separated by a suitable dielectric material 88. The conductor 86 is grounded to function as the ground plane for the transmission line 82. The transmission line 82 is functionally separable into two parts which include a resonant tank section 90 and an impedance transforming section 92. The diode 80 is mounted between the conductors 84 and 86 at substantially the junction of these two transmission line sections. A coaxial connector 94, including an outer conductor connected to the ground plane 86 and an inner conductor which passes through an aperture in the ground plane 86 to make electrical contact with the conductor 84, is mounted on the end of the impedance transforming section 92 which is remote from the diode 80. The connector 94 provides the R-F input and output connection to the negative resistance amplifying circuit 32 and is coupled to the terminals 24 of the directional filter 22 as shown in FIGURE 2.

To provide biasing for the diode 80, the series combination of a bias stabilizing resistor 95 and an inductor 96 (shown schematically) are connected between the conductors 84 and 86 in the impedance transforming section 92 of the transmission line structure 82. The inherent inductance in the lead lengths may, at some frequencies, be substituted for the inductor 96. A D.C. bias voltage supply 97, which includes the series combination of a battery 98 and a variable resistor 100 (shown schematically), is connected across the series combination of the resistor 95 and inductor 96. The magnitude of the resistor 95 is selected to be less than the absolute value of the minimum negative resistance of the diode 80 to provide, in parallel combination with the resistor 100, a D.C. load line 20 as shown in FIGURE 1. The location of the resistor 95 was determined experimentally to provide a minimum A.C. load on the diode 80 throughout the amplifier passband.

The resonant tank section 90 is designed to have a characteristic impedance which is slightly mismatched from the absolute value of minimum negative resistance of the diode 80 and is dimensioned to resonate with the inherent reactance of the diode 80 at the mean operating frequency of the amplifier to provide a broadly tuned tank. The impedance transforming section 92, which is curved to conserve space, is also tapered to provide an impedance transformation of the usual load conductance of 0.02 mho (50 ohms) connected across the coaxial connector 94 to a higher conductance which, in combination with the conductance of the bias stabilizing resistor 95 presents a positive conductance which exceeds the negative conductance of the diode 80 by an amount sufficient to provide stable operation at high gain. Thus the amplifying circuit 32 is properly loaded for preventing instabilities when a 50 ohm load is connected across the connector 94.

Referring now to FIGURE 2, as well as FIGURE 3 and 5, the operation of the amplifier is such that, within the frequency passband of the directional filter 22, which is designed to be coextensive with the amplifier passband, an input signal from the signal source 34 is coupled to the terminals 26 of the directional filter 22 and is transmitted substantially un-attenuated by the filter 22 to the terminals 24 thereof. The negative resistance amplifying circuit 32 is coupled to the terminals 24 and wave energy incident on the input thereto is amplified by the two-terminal negative resistance amplifier. The amplified wave energy is reflected back to the terminals 24 of the directional filter 22 and appears substantially unattenuated at the terminals 26. Amplified signal energy therefrom is applied to the load or utilization circuit 35.

The impedances of the signal source and load circuits 34 and 35 are selected to properly load the negative resistance amplifying circuit 32 to provide high gain with operating stability throughout the amplifier passband.

At frequencies outside of the passband of the directional filter 22, the amplifying circuit 32 is electrically connected directly to the terminating resistor 36 of the directional filter 22. Similarly the signal source circuit 34 is connected to the parallel combination of the terminating resistor 38 of the directional filter 22 and the load circuit 35. The terminating resistor 36 (as well as resistor 38) has a resistance value of 50 ohms so that a 50 ohm impedance load is presented to stabilize the negative resistance amplifying circuit 32 at these frequencies outside the amplifier passband.

Thus in accordance with the invention a negative resistance diode amplifier is properly loaded at all frequencies by a predetermined impedance which is selected to prevent the negative resistance diode from oscillating. A stable and efficient negative resistance amplifier is thereby achieved.

Referring to FIGURE 6, wherein circuit components similar to those in FIGURE 2 have been given identical reference numerals, a non-reciprocal wave transmitting device 101 is incorporated into a negative resistance amplifier in accordance with the invention. The non-reciprocal device may, for example, comprise a three port (six terminals) ferrite circulator 101 having input, intermediate and output ports 102, 103 and 104 respectively. Such circulators have been described in the literature, as for example in Patent No. 2,794,172. The signal source circuit 34 is coupled to the input port 102 of the circulator 101 while the load circuit 35 is coupled to the output port 104 thereof. The negative resistance amplifying circuit 32 is coupled to the circulator 101 by connecting the negative resistance amplifying circuit 32 to the first pair of terminals 24 of the directional filter 22 and the intermediate port 103 of the circulator 101 to the second pair of terminals 26 thereof. The terminating resistors 36 and 38 are connected across the third and fourth pairs of terminals 28 and 30 respectively of the filter 22.

The circulator 101 is selected to have a rated frequency range which is coextensive with the amplifier frequency passband and the directional filter 22 passband. Throughout the rated frequency range the circulator 101 presents a substantially constant impedance, as for example 50 ohms, to the directional filter 22 regardless of variations in signal source and load circuit 34 and 35 impedances.

The operation of the circuit of FIGURE 6 is similar to that of FIGURE 2. However in this embodiment of the invention the two terminal negative resistance amplifier is effectively transformed into a four terminal network due to the non-reciprocal wave transmitting properties of the circulator 101. Within the ampifier frequency passband, wave energy incident on the input port 102 of the circulator 101 appears at the intermediate port 103 but not at the output port 104 thereof. The wave energy appearing at the intermediate port 103 is applied through the directional filter 22 to the negative resistance amplifying circuit 32 where it is amplified and reflected back to the intermediate port 103 of the circulator 101. From the intermediate port 103 all of the amplified signal energy is transmitted to the output port 104 of the circulator 101 with substantially no wave energy being reflected back to the input port 102 of the circulator 101.

Thus in accordance with the invention, a negative resistance amplifier is efficiently stabilized at all frequencies as well as being effectively transformed into a four terminal network.

In FIGURE 7, an embodiment of a stabilized negative resistance amplifier in accordance with the invention is shown and includes a transmission line hybrid 105. The hybrid 105 is of the conventional four port (eight terminal) ring type having a characteristic impedance of 50 ohms and includes an input port 106, a pair of intermediate ports 107 and 108, and an output port 110. The intermediate ports 107 and 108 are spaced on either side of the input port 106 at electrical distances therefrom which are each equal to one quarter of a wavelength at the mean operating frequency of the amplifier. The output port 110 is located between the intermediate ports 107 and 108 at an electrical distance from the port 108 which is equal to one quarter of a wavelengh at the mean operating frequency of the amplifier and at an electrical distance from the port 107 which is three quarter of a wavelength at the same frequency. A negative resistance amplifying circuit 112, of the type shown in FIGURE 5, is coupled to the intermediate port 107 through a coupling connection 114 which has a given electrical length ($l$). A similar amplifying circuit 116 is coupled to the other intermediate port 108 through a coupling connection 118, which has an electrical length equal to ($l+\lambda/4$), where $\lambda$ is one wavelength at the mean operating frequency of the amplifier. The extra length in connection 118 (as compared to the length ($l$) of the coupling connection 114) may for example comprise a quarter wave transmission line and provides a necessary wave energy phase shift, as will be explained subsequently. A signal source circuit 120 is coupled to the input port 106 through a directional filter 122 of the type shown in FIGURE 3. A load circuit 124 is coupled to the output port 110 of the hybrid 105 through a directional filter 126 similar to the filter 122. A pair of resistors 128 and 130 terminate the directional filter 122 while a similar pair of resistors 132 and 134 terminate the directional filter 126.

In operation, input signals within the amplifier frequency passband are applied from the signal source circuit 120 through the directional filter 122 to the input port 106 of the hybrid 102. The wave energy entering the port 106 divides substantially equally, one half being amplified by the negative resistance amplifying circuit 112 while the other half is amplified by the negative resistance amplifying circuit 116. The component amplified by amplifier 116 however is shifted in phase with respect to the clockwise component by an amount equal to 180° due to the length ($l+\lambda/4$) of the coupling connection 118 being greater than the length ($l$) of the coupling connection 114 by a quarter of a wavelength and traversing this length twice. Consequenlty with this added phase shift, the two components of wave energy from the two negative resistance amplifiers 112 and 116 arrive in phase at the output port 110 rather than out of phase. The amplified signal from the output port 110 is applied through the directional filter 126 to the load circuit 124.

The amplified components of wave energy from the amplifying circuits 112 and 116 however cancel at the input port 106 due to the 180° phase differential introduced by the coupling connection 118. With a load circuit 124 impedance matched to the hybrid 105 impedance substantialy no wave energy reflections will occur thereby providing a matched loading on the signal circuit 120.

At frequencies outside the amplifier passband, the directional filters 122 and 126 isolate the negative resistance amplifying circuits 112 and 116 from the signal source 120 and load 124 circuits. At these outside frequencies, the amplifying circuits 112 and 116 are loaded by the terminating resistors 128 and 132 in the directional filters 122 and 126 respectively.

Thus in accordance with the invention a negative resistance amplifier is properly loaded at all frequencies to prevent spurious oscillations thereby resulting in a stable amplifier.

What is claimed is:

1. A high frequency signal translating circuit having a predetermined frequency passband comprising a signal input circuit, a signal output circuit, a two terminal amplifier device, first filter means coupled to said signal input circuit and said signal output circuit and having a pair of terminals presenting substantially constant impedance over said predetermined frequency passband, second filter means coupling the terminals of said filter means to said two terminal amplifier device over said predetermined frequency passband, but isolating said terminals from said amplifier device for frequencies outside of said predetermined passband, the substantially constant impedance presented by said terminals and the impedance of said second filter means outside of said predetermined frequency passband being of a value to maintain the two terminal amplifier device stable.

2. An electrical circuit comprising in combination a negative resistance amplifier, a signal source circuit, a load circuit, a frequency responsive network having a plurality of terminals, said negative resistance amplifier coupled to a first pair of terminals of said network, a second pair of terminals of said network coupled to signal source and load circuits, and first and second impedance devices coupled to third and fourth pairs of terminals respectively of said network, said frequency responsive network exhibiting the characteristic that over a predetermined band of frequencies said first and second pairs of terminals are electrically connected to each other but both are electrically isolated from said third and fourth pairs of terminals, while outside of said predetermined band of frequencies said first and second pairs of terminals are electrically isolated from each other but are electrically connected to said third and fourth pairs of terminals respectively.

3. An electrical circuit comprising in combination a negative resistance amplifier, a directional filter having a plurality of terminals, said negative resistance amplifier coupled to a first pair of said terminals, signal source and load circuits coupled to a second pair of said terminals and a pair of impedance devices individually connected to each of a third and fourth pair of terminals of said directional filter.

4. An electrical circuit comprising in combination a transmission line directional filter having four pairs of terminals, a negative resistance amplifier coupled to a first pair of said terminals, a non-reciprocal wave transmitting device having input, intermediate and output ports, said intermediate port of said non-reciprocal device coupled to a second pair of said terminals, and a pair of impedance devices individually coupled to the third and fourth pairs of terminals of said directional filter, said input and output ports of said non-reciprocal device coupled to signal source and load circuits respectively.

5. An electrical circuit comprising in combination a two terminal negative resistance amplifying circuit, a circulator having first, second and third ports spaced therearound, means providing a source of signals to be amplified coupled to said first port, and means providing a utilization circuit coupled to said third port, a directional filter having a first pair of terminals coupled to said second port and a second pair of terminals coupled to said two terminal negative resistance amplifying circuit, said directional filter exhibiting the characteristic that over a predetermined band of frequencies to be amplified said first and second pairs of terminals are electrically connected to each other while outside of said predetermined band of frequencies said first and second pairs of terminals are electrically isolated from each other.

6. An electrical circuit comprising in combination a negative resistance amplifier exhibiting stable amplification over a predetermined frequency passband with a predetermined load impedance but which is subject to spurious oscillations outside of said frequency passband due to load impedance variations with frequency, a wave energy transmitting device exhibiting an impedance which is substantially equal to said predetermined load impedance over said amplifier frequency passband but which differs from said predetermined load impedance at frequencies outside of said passband, a directional filter having four pairs of terminals and being frequency responsive to the extent that within said amplifier frequency passband first and second pairs of said terminals are bilaterally coupled to each other but electrically isolated from the third and fourth pairs of terminals while outside of said passband said first and second pairs of terminals are electrically coupled to said third and fourth pairs of terminals respectively but electrically isolated from each other, first and second resistors each having a resistance magnitude substantially equal to said predetermined load impedance connected individually to said third and fourth pairs of terminals respectively, and means coupling said negative resistance amplifier to signal source and load circuits which have impedances which vary with frequency, said means including said wave energy transmitting device and said first and second pairs of terminals of said directional filter, whereby said amplifier is coupled to said signal source and load circuits through said first and second pairs of terminals of said filter throughout said amplifier frequency passband but is coupled to said first resistor through said first and third pairs of terminals of said filter outside of said frequency passband whereby spurious oscillations are prevented.

References Cited by the Examiner

UNITED STATES PATENTS

| | | | |
|---|---|---|---|
| 2,794,172 | 5/57 | Kock | 333—24 X |
| 2,794,864 | 6/57 | Shockley | 333—80 X |
| 2,899,652 | 8/59 | Read | 333—80 |
| 2,914,249 | 11/59 | Goodall | 333—11 |
| 3,112,454 | 11/63 | Steinhoff | 330—34 X |

OTHER REFERENCES

Hines: "High-Frequency Negative-Resistance Circuit Principles for Esaki Diode Applications," Bell System Tech. Journal, pages 477–513, May 1960.

Sommers: "Tuned Diodes as High Frequency Devices," Proc. IRE, July 1959, pages 1201–1206.

ROY LAKE, *Primary Examiner.*

BENNETT G. MILLER, NATHAN KAUFMAN, *Examiners.*